United States Patent

[11] 3,562,605

[72] Inventors Herbert E. Ferree
Greensburg;
Chang K. Chu, Pittsburgh, Pa.
[21] Appl. No. 797,931
[22] Filed Feb. 10, 1969
[45] Patented Feb. 9, 1971
[73] Assignee Westinghouse Electric Corporation
Pittsburgh, Pa.
a corporation of Pennsylvania

[54] VOID-FREE PRESSURE ELECTRICAL CONTACT FOR SEMICONDUCTOR DEVICES AND METHOD OF MAKING THE SAME
5 Claims, 2 Drawing Figs.

[52] U.S. Cl. .................................................... 317/234,
317/235; 29/194, 29/199, 29/472.3, 29/589
[51] Int. Cl. .................................................... H01l 3/00,
H01l 5/00
[50] Field of Search .......................................... 317/234,
235, 4, 5, 5.1, 5.2, 5.3, 6; 29/199, 194, 497.5, 498, 471.3, 504, 470, 589, 592, 473.5, 472.3; 313/334, 331, 332, 355

[56] References Cited
UNITED STATES PATENTS

| | | | |
|---|---|---|---|
| 3,212,160 | 10/1965 | Dale et al. ...................... | 317/234 |
| 3,307,088 | 2/1967 | Fujikawa et al. .............. | 317/234 |
| 3,483,442 | 12/1969 | Csakvary ...................... | 317/234 |
| 3,492,545 | 1/1970 | Meyerhoff .................... | 317/234 |

*Primary Examiner*—John W. Huckert
*Assistant Examiner*—Andrew J. James
*Attorneys*—F. Shapoe and C. L. Menzemer

ABSTRACT: An electrically and thermally conductive partially deformable member is employed in a pressure electrical contact assembly to provide an intimate electrical and thermal contact relationship between the member and adjacent components in physical contact with it. The partially deformable member may be utilized between a pressure electrical contact to the semiconductor element and the element itself or between the backup electrode affixed to the element and the support member upon which the backup electrode is disposed. This intimate contact relationship improves the forward voltage drop characteristic of the device and distributes the force loading uniformly over the surfaces of the components to which it is in physical contact.

WITNESSES
Wm. B. Sellers
Donald M. Winegar

INVENTORS
Herbert E. Ferree and
Chang K. Chu
BY
C. L. Menzemer
ATTORNEY

VOID-FREE PRESSURE ELECTRICAL CONTACT FOR SEMICONDUCTOR DEVICES AND METHOD OF MAKING THE SAME

BACKGROUND OF THE INVENTION

1. Field of the Invention

This invention relates to semiconductor electrical devices embodying pressure electrical contacts.

2. Description of the Prior Art

Heretofore semiconductor electrical devices embodying pressure electrical contacts employed an annealed silver member between contact surfaces to compensate in part for the unevenness of the mating surfaces and to reduce the forward voltage drop of the electrical device. However, voids still occur between the mating surfaces of the silver member and the contact surfaces thereby causing high contact resistance and high thermal impedance to occur between opposed contact surfaces.

SUMMARY OF THE INVENTION

In accordance with the teachings of this invention, there is provided an improved means for increasing the electrical and thermal conductivity relationship between opposed electrical contact surfaces of an electrical device, the improvement comprising an electrically and thermally conductive partially deformable member disposed between other opposed contact surfaces, the member being comprised of a metal alloy having a solidus temperature in excess of the operating temperature of the device and below that temperature at which degradation of the physical and electrical characteristics of other components comprising the device will occur.

An object of the this invention is to provide a substantially void free electrical contact between mating electrical contact surfaces.

Another object of this invention is to provide a partially deformable, electrically and thermally conductive member disposed between electrical contacts surfaces to provide a substantially void free electrical contact and to distribute the force of the pressure electrical contact substantially uniformly over the mating surfaces.

Another object of this invention is to provide a process for making an electrical device having a substantially void free electrical contact between mating electrical contact surfaces.

Other objects of this invention will, in part, be obvious and will, in part, appear hereinafter.

DRAWINGS

Figure 1:
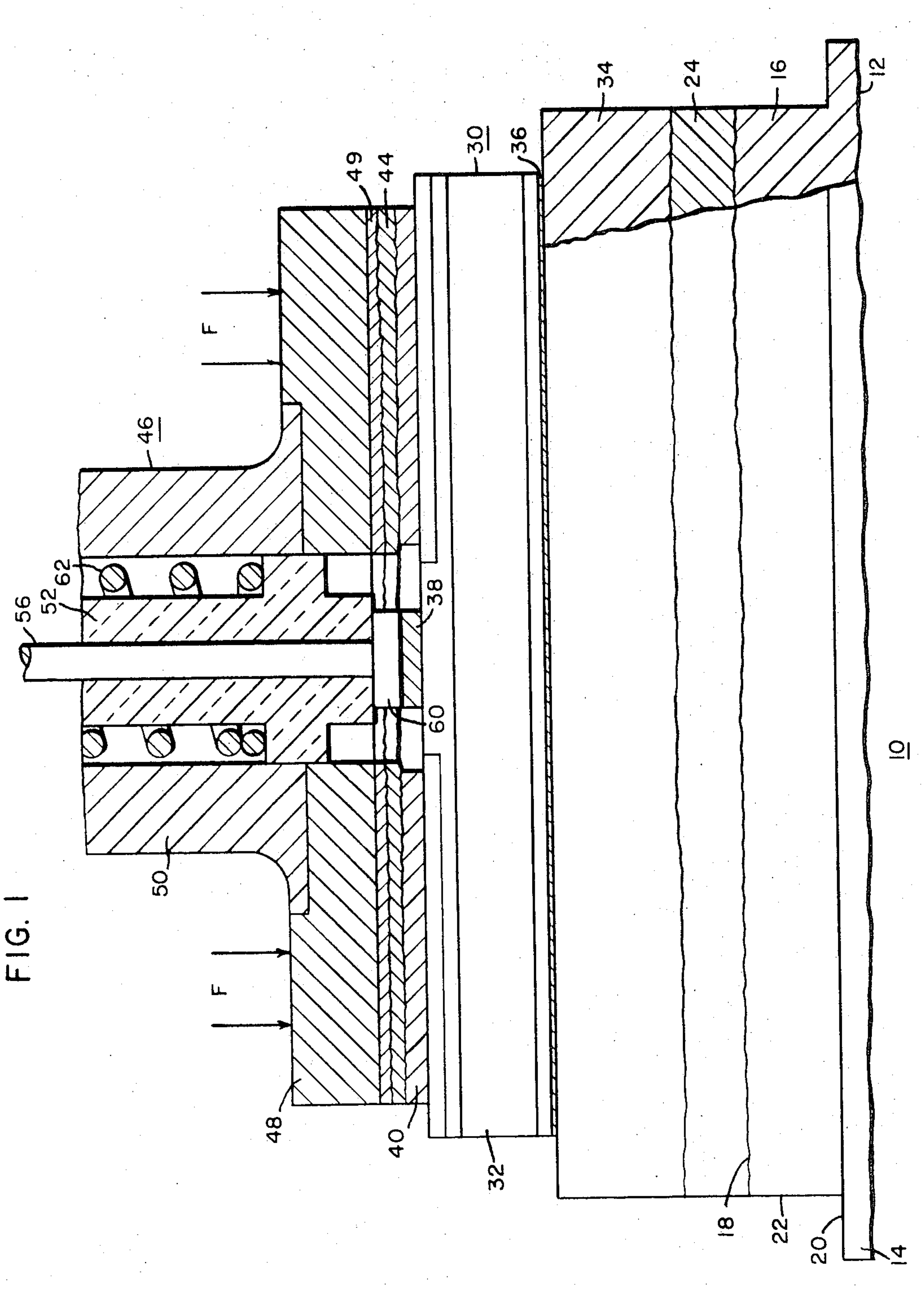
Figure 2:
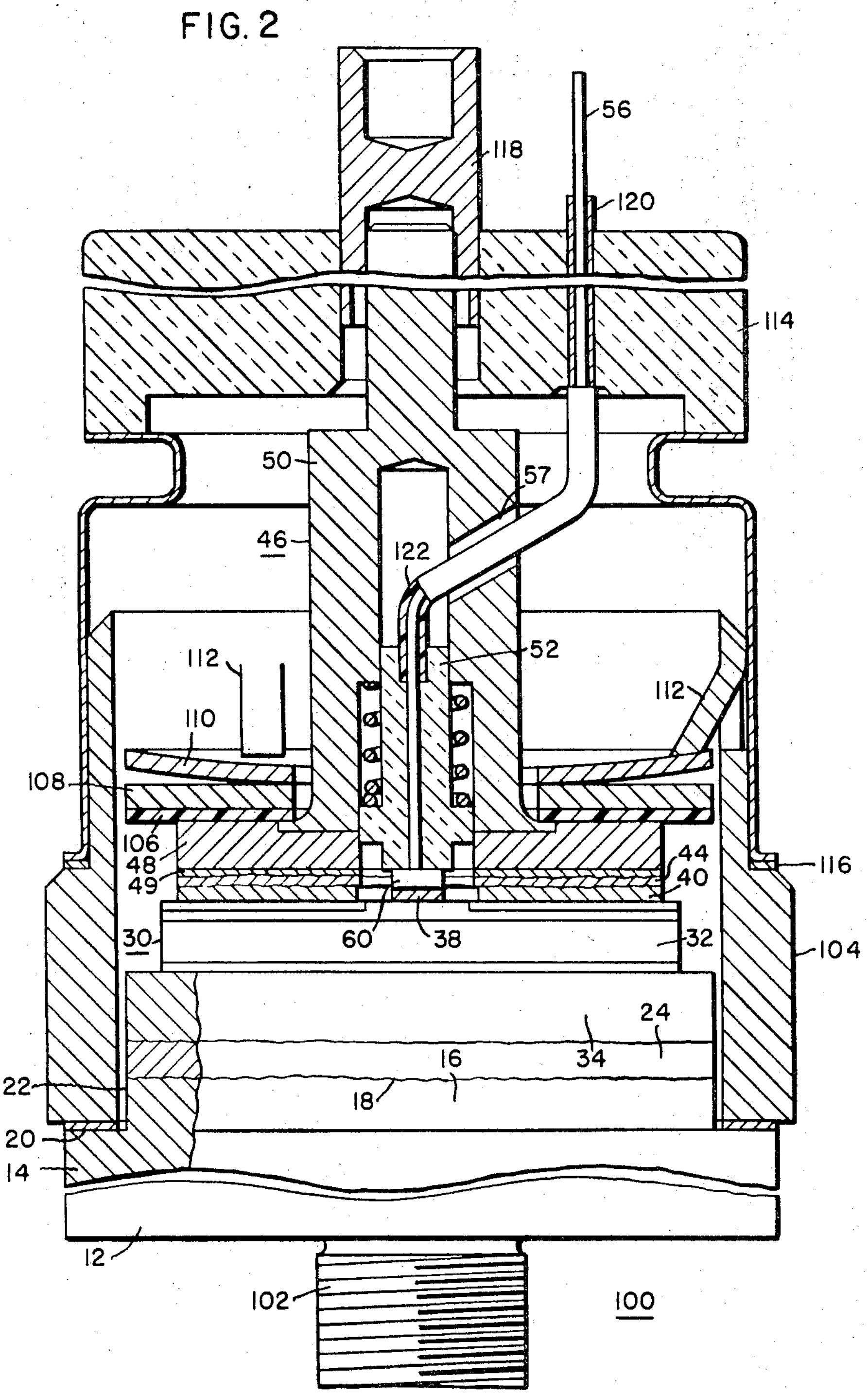

In order to more completely understand the nature and objects of this invention, reference should be had to the following drawings in which:

FIG. 1 is a view, partly in cross section, of a portion of an electrical device made in accordance with the teachings of this invention; and FIG. 2 is a view, partly in cross section, of an electrical device made in accordance with the teachings of this invention.

DESCRIPTION OF THE INVENTION

With reference to FIG. 1 there is shown a portion 10 of an electrical device embodying the teachings of this invention. The portion 10 comprises a support member 12, comprising a peripheral flange 14 and an upwardly extending pedestal portion 16. The upwardly extending pedestal portion 16 has an uppermost mounting surface 18. The surface 18 may have an electrically conductive metal such, for example as gold or silver, plated on its surface. The peripheral flange 14 has a top surface 20 and the upwardly extending pedestal portion 16 has a peripheral side surface 22.

The support member 12 is made of a metal selected from the group consisting of copper, silver, aluminum, base alloys thereof, and ferrous base alloys such as steel. Copper and brass, a base alloy of copper, have been found particularly satisfactory for this purpose.

A nonreactive, electrically and thermally conductive layer 24 of material is disposed on the uppermost mounting surface 18 of the support member 18. The material comprising the layer 24 has physical properties which include a resistance to cold flow under pressure at room temperature and therefore it acts as a rigid member. The material preferably is a metal alloy having a solidus temperature above the normal operating temperature of the electrical device embodying the portion 10. The solidus temperature should not be too high as a subsequent baking process step in necessary after assembly of all components and prior to the hermetic encapsulation of the device thereby preventing any physical damage to, as well as degradation of electrical properties of, the device. At about the operating temperature of the device, the material should have the ability to partially deform when subjected to a pressure of about 800 pounds per square inch and then to essentially cease deforming and act as a rigid member to continue to transmit the 800 pound per square inch pressure loading at the elevated temperature without any further appreciable deformation. Additionally, the metal alloy should have a melting temperature sufficiently above the solidus temperature of the metal to prevent a sudden surge of thermal energy during assembly and testing processes from causing the layer 24 to melt and suddenly flow within the device. The melting of the layer 24 could cause electrical shorting to occur and release of pressure which may cause poor electrical performance. The metal alloy of the layer 24 must be substantially resistant to oxidation. If oxidation should occur, the metal oxide so formed should be electrically conductive. It is not necessary that metal alloy of the layer 24 wet the surfaces of components in intimate contact with it, but the material should have enough homogeneity to partially flow under pressure at about its solidus temperature to match the surface irregularities of the components with which it is in contact. The metal alloy of the layer 24 should also have a low vapor pressure. Suitable metal alloys for use in making the layer 24 are a tin-lead alloy comprising 30 percent by weight tin and the remainder lead and a tin-silver alloy comprising 95 percent by weight tin and the remainder silver.

A modification of the layer 24 consists of a composite member and incorporates the metal alloy comprising the layer 24. The metal alloy comprising the layer 24 is disposed on opposed major surfaces of a second metal or metal alloy member to form a sandwichlike structure. The second member is preferably an electrically and thermally conductive material having a melting temperature much higher than the operating temperature of the electrical device. The second member also is one which is not readily partially deformable at either room temperature or at the operating temperature of the electrical device if the working pressure of the device is applied to the second member alone. Suitable materials for making the second member are silver, copper and aluminum.

A semiconductor fusion assembly 30 is disposed on the layer 24. The fusion assembly 30 comprises a semiconductor element 32 affixed to a first electrical contact 34 by a layer 36 of a suitable solder or brazing composition. The control 34 acts also as a support member for the element 32. Although the element 32 may have only two regions of opposite type semiconductivity and a PN junction disposed therebetween, the element 32 will be described as being a four region semiconductor element to which three electrical contacts, including the contact 34, are connected in order to more clearly describe the invention, and for no other purpose.

The electrical contact and support member 34 comprises a metal, such, for example, as molybdenum, tungsten, tantalum, and combinations and base alloys thereof. The contact 34 is a firm supporting member for the semiconductor element 32. The contact 34 has good electrical and thermal conductivity properties, as well as thermal expansion characteristics which are very similar to those of the semiconductor element 32.

The layer 36 of solder may comprise any suitable "hard" or "soft" solder known to those skilled in the art. Preferably, the solder layer 36 comprises solders, such, for examples, as alloys of gold, for example, gold-antimony, which form eutectic compositions with silicon and also a metallurgical bond to molybdenum, tungsten, tantalum, and their alloys as well as other gold alloy compositions, alloys of aluminum and alloys of silver, each of which having a melting point above 350° and having a greater strength and hardness than the common solder alloys of lead and tin. The melting point of the solder layer 36 must be greater than the solidus temperature of the metal of the layer 24.

It will be understood, of course, that the particular type of solder will depend on the anticipated operating temperature range of the finished electrical device.

A second electrical 38, known as a gate contact, is electrically connected to the element 32. A third electrical contact 40, is disposed about, and separate from, the gate contact 38 and is electrically connected to the element 32.

An apertured nonreactive layer 44 of an electrically and thermally conductive metal, consisting of the same metal alloy as that comprising the layer 24, is disposed on the contact 40 of the fusion assembly 30. The purpose of the layer 44 is the same as layer 24.

A multiple electrical contact assembly 46 is disposed in part on the apertured nonreactive layer 44. The contact assembly 46 comprises a molybdenum washer 48 brazed to an electrical connector 50 extending upwardly from the washer 48. A layer 49 of silver is brazed to the molybdenum washer 48. An electrically insulating bushing 52 is slidably mounted inside a hollow portion of the connector 50.

A first electrical lead 56 extends down through the center of the hollowed-out portion terminating in a button-shaped contact member 60. A force is applied and maintained on the button-shaped contact member 60 by means of resilient force means 62 positioned within the connector 50 and acting on the peripheral shoulder of the bushing 52, the bushing 52 in turn acting on the contact 60. The contact member 60 extends through the aperture of the layer 44 and is disposed on the contact 38 of the fusion assembly 30.

A force denoted as F is applied to the multiple contact assembly 46 while the portion 10 of the electrical device is baked. The force is the same as, or slightly higher, than the force encountered in the completed device. Preferably the force F is supplied by the protrusions 112 acting on components disposed on portions of the contact assembly 46 and are described in greater detail in reference to FIG. 2. The baking of the portion 10 comprises heating the portion 10 in a nonoxidizing atmosphere, a reducing atmosphere, or in a vacuum, to an elevated temperature just below the solidus temperature of the metal alloy comprising the layers 24 and 44. This enables the surfaces of the layer 24 and 44 to mold themselves to the same contours of the contiguous surface of the components adjacent to them thereby achieving an intimate substantially void free electrically and thermally conductive relationship between the layers 24 and 44 and the adjacent components. The portion 10 is then cooled, encapsulated within an electrical device, and is ready for electrical operation. The layers 24 and 44 do not bond components together as the layers 24 and 44 do not form a solder joint but a pressure electrical contact between components.

Referring now to FIG. 2, there is shown an electrical device 100 embodying the portion 10.

An electrical contact and thermal dissipating stud 102 si is either affixed to, or is integral with, the support member 12. The stud 102 may be used to connect the support member 12 to either an electrical conductor or a heat sink member.

An upwardly extending hollow, or tubular, member 104 is affixed to the support member 12. The inner periphery of the member 104 conforms to the peripheral surface 22 of the pedestal portion 16. The member 104 is affixed to the support member 12 by any suitable means known to those skilled in the art, such, for examples, as by disposing a suitable braze material between top surface 20 of the flange 14 and the side surface 22 of the pedestal portion 16 and a portion of the inner periphery and part of the bottom surface of the member 24. The member 104 is preferably made of a ferrous base material.

The fusion assembly 30 is axially aligned within the member 104. An electrical insulating washer 106 is placed over the connector 50 of the contact assembly 46 and disposed on the molybdenum washer 48 of the multiple electrical contact assembly 46. A metal thrust washer 108 is disposed on top of the insulating washer 106. At least one resilient member such, for example, as a convex spring washer 110 is placed over the connector 50 and disposed on the thrust washer 108.

Protrusions 112 acting on the convex spring washer 110 furnish the force F (FIG. 1) necessary to retain the components in a pressure electrical and thermal contact relationship necessary for the baking process of the portion 10 and the operation of the device 100. Preferably these protrusions are formed before the baking process of the layers 24 and 44. This is possible because the deformation of the layers 24 and 44 necessary to form an essentially void free electrical contact causes a negligible reduction of the force produced by the protrusions 112.

The device 100 is completed by hermetically sealing the fusion assembly 30 within a header assembly 114 affixed to a weld ring 116 formed on the member 104. The connector 50 is electrically connected to an electrical connector 118 hermetically sealed in the assembly 114. The lead 56 extends upwardly within the hollow portion of the connector 50, passes through a slot 57 in the sidewall of the partially hollow connector 50 and is electrically connected to a hollow connector 120 hermetically sealed within the assembly 114 thereby completing the hermetic sealing of the pressure electrical contact assembly. When required, the lead 56 is suitably protected by a layer 122 of electrical insulating material.

The following examples are illustrative of the teachings of this invention:

Example 1

Four electrical devices were made in accordance with the teachings of this invention as shown in FIGS. 1 and 2 except that the layers 24 and 44 each comprise annealed silver members and the header assembly 114 was omitted.

After formation of a pressure electrical contact between the components of each device, the forward voltage drop was determined for each of the devices. The results obtained were as follows:

| Semiconductor fusion assembly: | Forward voltage drop at 1,500 amps., volts |
|---|---|
| 1 | 2.67 |
| 2 | 2.48 |
| 3 | 1.95 |
| 4 | 2.20 |

The devices were disassembled and the surfaces of the annealed silver members were examined. Each surface showed numerous indentations indicating that the electrical contact between adjacent members was substantially a plurality of point contacts.

Example 11

Each of the semiconductor fusion assemblies of example 1 were assembled into four new electrical devices which were the same as the devices of example 1 except that the layers 24 and 44 each comprised an alloy of 95 percent by weight tin and 5 percent by weight silver.

After formation of a pressure electrical contact between the components of each device, the forward voltage drop was determined for each of the devices. The results obtained were as follows:

| Semiconductor fusion assembly: | Forward voltage drop at 1,500 amps., volts |
|---|---|
| 1 | 2.73 |
| 2 | 2.78 |
| 3 | 2.40 |
| 4 | 2.36 |

The devices were disassembled and the surfaces of the tin silver alloy layers were examined Each surface showed numerous indentations indicating that the electrical contact between adjacent members was still substantially a plurality of point contacts Example III Each of the semiconductor fusion assemblies of example II were assembled into four new electrical devices which were the same as the device of example II The electrical devices of example II were placed in a vacuum furnace and the devices were baked at a temperature of 175° C. ± 15° C. for 24 hours in a vacuum of 10 torr. The devices were cooled to room temperature and the forward voltage drop was determined for each device. The results obtained are as follows:

| Semiconductor fusion assembly: | Forward voltage drop at 1,500 amps., volts |
|---|---|
| 1 | 2.38 |
| 2 | 2.16 |
| 3 | 1.84 |
| 4 | 2.07 |

The devices were then disassembled to examine the surfaces of the tin-silver alloy layers. Each layer had to be "peeled" off of the surfaces adjacent to, and in intimate contact with, them.

Examination of each surface showed that the surface had been impressed with the complete detailed surface of the member in physical contact with it. It clearly indicated a substantially void free electrical contact between adjacent members.

Example IV

Each of the semiconductor fusion assemblies of example III were assembled into four electrical devices which were the same as the devices of example II.

The electrical devices were then placed in a vacuum furnace and the devices were baked at 200° C. ± 15° C. for two hours in a vacuum of 10 torr. The devices were to room temperature and the forward voltage drop was determined for each device. The results obtained are as follows:

| Semiconductor fusion assembly: | Forward voltage drop at 1,500 amps., volts |
|---|---|
| 1 | 2.40 |
| 2 | 2.18 |
| 3 | 1.92 |
| 4 | 2.14 |

The devices were then disassembled to examine the surfaces of the tin-silver alloy layers. Each layer had to be "peeled" away from the mating surface of the adjacent member.

Examination of each surface showed that an intimate, substantially void-free physical as well as an electrical contact has been achieved between adjacent members. The surface contours of the adjacent members were clearly impressed in sharp detail in the surface of the adjacent baked tin-silver alloy layer. The results showed that the substantially void-free electrical contact could be formed at a higher temperature for a shorter baking time than those of example III and the electrical contacts was just as good as those of example III.

The results obtained indicate that the forward voltage drop of the devices was lowest where the tin-silver alloy comprised the layers 24 and 44. Regardless of the baking temperature and time, when the layers 24 and 44 were made of the tin-silver alloy, the forward voltage drops where about the same in which case either baking process proved to be a satisfactory step.

While this invention has been shown in only a few embodiments, it will be obvious to those skilled in the art that modifications, substitutions, and the like may be made therein without departing from its scope.

We claim:

1. In an electrical device in which at least one electrical and thermal conductive relationship between two components is maintained only by a compressive force, including two components having major opposed surfaces thereof, an improved means for increasing the electrical and thermal conductivity relationship between said major opposed surfaces of said two components, the improvement comprising an electrically and thermally conductive partially deformable member disposed between said components, and in physical contact with said major opposed surfaces, but not joined to, said components surfaces, said deformable member comprises a material selected from the group consisting of an alloy consisting of 95 percent by weight tin and 5 percent by weight silver and an alloy consisting of 30 percent by weight tin and 70 percent by weight lead.

2. The electrical device of claim 1 in which:
one of the components is a semiconductor element; and
the other of the components is an electrical contact electrically connected to said semiconductor element; and including:
a second electrical contact affixed to said semiconductor element;
an electrically and thermally conductive support member, said second electrical contact being disposed upon, and electrically connected to, said support member; and
a second electrically and thermally conductive partially deformable member disposed between, in physical contact with, but not joined to, said second electrical contact and said support member.

3. The electrical device of claim 1 including:
a second electrical contact disposed upon, and electrically connected to, said semiconductor element; and
a third electrical contact disposed upon, and electrically connected to, said semiconductor element.

4. The electrical device of claim 1 including a third electrical contact disposed on, and electrically connected to, said semiconductor element.

5. The electrical device of claim 1 in which said partially deformable member consists of:
an electrically and thermally conductive member having two major opposed surfaces and consisting of a material selected from the group consisting of copper, aluminum, and silver; and
a layer of a material selected from the group consisting of an alloy consisting of 95 percent by weight tin and 5 percent by weight silver and an alloy consisting of 30 percent by weight tin and 70 percent by weight lead disposed on each of the two major opposed surfaces of said member.